(12) United States Patent
Tsuchida

(10) Patent No.: US 11,516,907 B2
(45) Date of Patent: Nov. 29, 2022

(54) GLASS WIRING BOARD

(71) Applicant: TOPPAN PRINTING CO.,LTD., Tokyo (JP)

(72) Inventor: Tetsuyuki Tsuchida, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/122,775

(22) Filed: Dec. 15, 2020

(65) Prior Publication Data

US 2021/0144847 A1  May 13, 2021

Related U.S. Application Data

(63) Continuation of application No. PCT/JP2019/022857, filed on Jun. 10, 2019.

(30) Foreign Application Priority Data

Jun. 19, 2018 (JP) .............................. JP2018-115885

(51) Int. Cl.
| | |
|---|---|
| H05K 1/02 | (2006.01) |
| H05K 1/09 | (2006.01) |
| H05K 3/10 | (2006.01) |
| H05K 3/18 | (2006.01) |
| C25D 7/00 | (2006.01) |

(52) U.S. Cl.
CPC ............ *H05K 1/0271* (2013.01); *C25D 7/00* (2013.01); *H05K 1/0242* (2013.01); *H05K 1/09* (2013.01); *H05K 3/108* (2013.01); *H05K 3/18* (2013.01); *H05K 2201/0341* (2013.01); *H05K 2201/0344* (2013.01); *H05K 2201/098* (2013.01);

(Continued)

(58) Field of Classification Search
CPC .. H05K 1/0242; H05K 1/0263; H05K 1/0265; H05K 1/0271

See application file for complete search history.

(56) References Cited

U.S. PATENT DOCUMENTS

| | | | | |
|---|---|---|---|---|
| 2002/0180027 A1* | 12/2002 | Yamaguchi | .......... | H05K 1/0271 257/772 |
| 2004/0235636 A1* | 11/2004 | Tsai | ........................ | C03C 3/095 501/64 |
| 2015/0208499 A1* | 7/2015 | Wu | ........................ | H05K 3/107 174/255 |

FOREIGN PATENT DOCUMENTS

| | | | | |
|---|---|---|---|---|
| EP | 3119169 A1 * | 1/2017 | .......... | H05K 1/0296 |
| JP | H1056247 A | 2/1998 | | |

(Continued)

OTHER PUBLICATIONS

International Searching Authority, "International Search Report," issued in connection with International Patent Application No. PCT/JP2019/022857, dated Sep. 3, 2019.

(Continued)

*Primary Examiner* — Jeremy C Norris
(74) *Attorney, Agent, or Firm* — Foley & Lardner LLP

(57) ABSTRACT

A glass wiring board that can be kept from cracking by better preventing concentration of stresses in a glass plate on which a conductor layer including an electrolytic copper plating layer is provided, the wiring board includes: a glass plate; a first metal layer covering at least a part of the glass plate; and a second metal layer covering at least a part of the first metal layer, and the area of the first metal layer in contact with the second metal layer is smaller than the area of the second metal layer facing the first metal layer.

7 Claims, 3 Drawing Sheets

(52) U.S. Cl.
CPC .............. *H05K 2201/09827* (2013.01); *H05K 2203/0723* (2013.01)

(56) References Cited

FOREIGN PATENT DOCUMENTS

| | | |
|---|---|---|
| JP | 2017-081781 A | 5/2017 |
| JP | 2018-093141 A | 6/2018 |
| JP | 2018-107256 A | 7/2018 |

OTHER PUBLICATIONS

International Searching Authority, "Written Opinion," issued in connection with International Patent Application No. PCT/JP2019/022857, dated Sep. 3, 2019.

Extended European Search Report issued in European Patent Application No. 19821501.4 dated Jun. 7, 2021.

\* cited by examiner

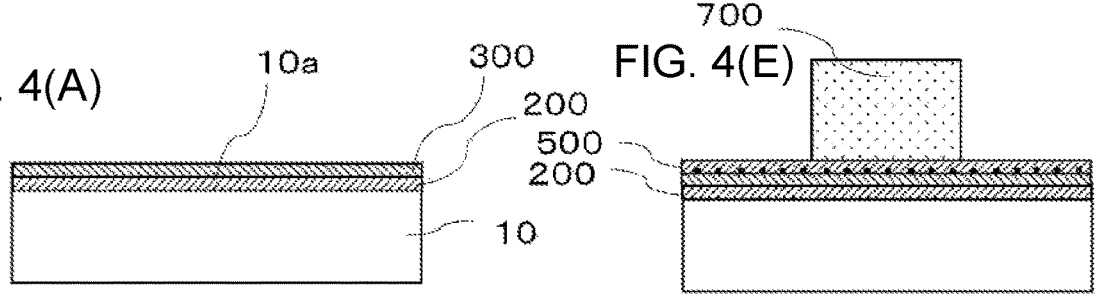
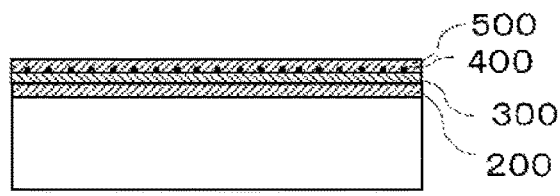
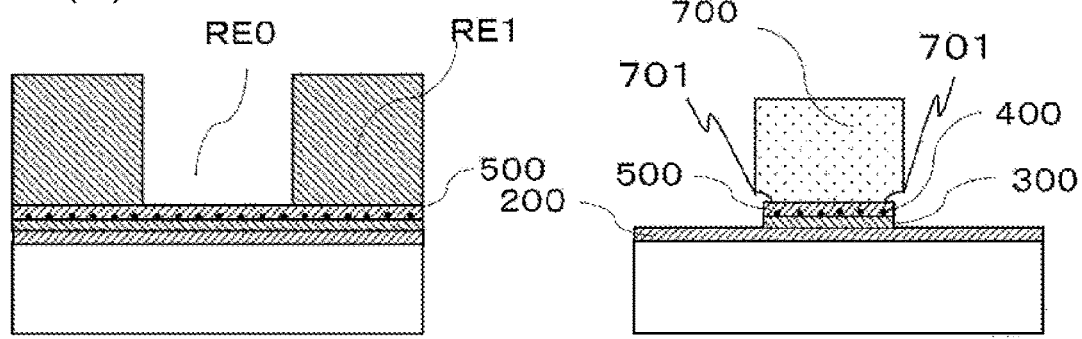
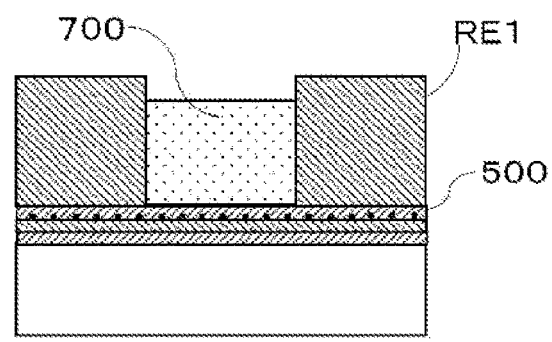
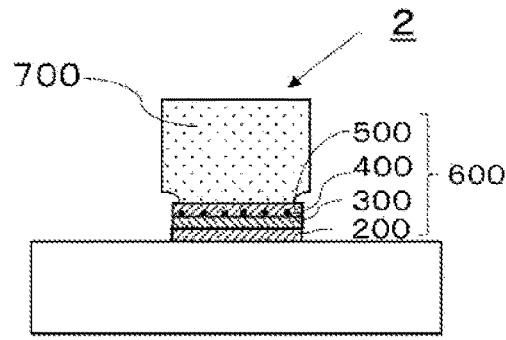

FIG. 5(A)
FIG. 5(B)
FIG. 5(C)
FIG. 5(D)
FIG. 5(E)
FIG. 5(F)
FIG. 5(G)
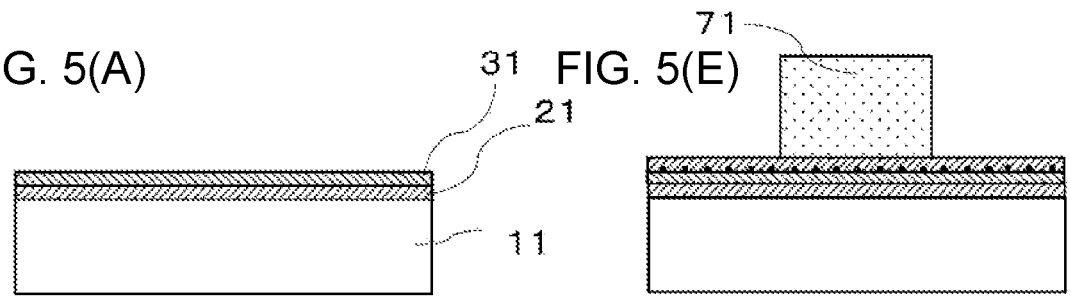
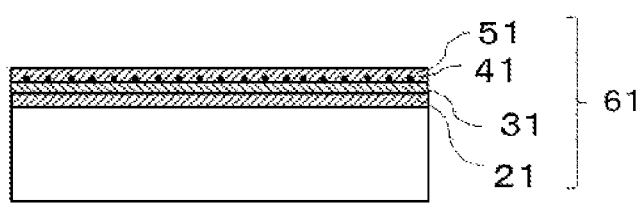
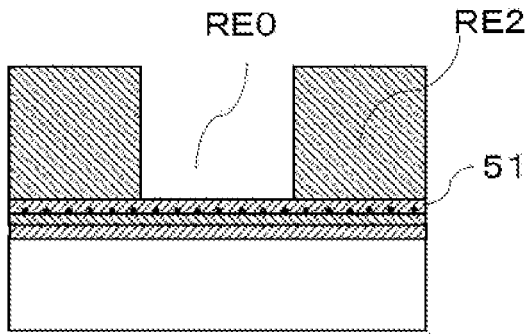
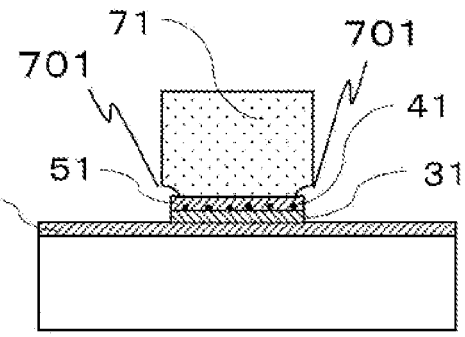
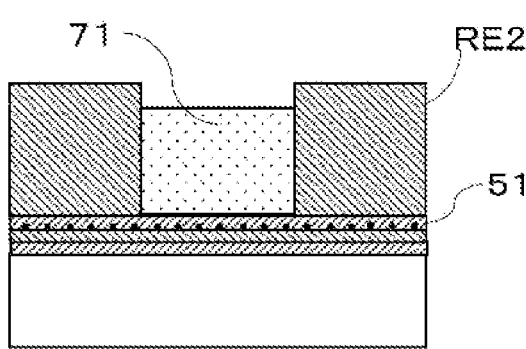
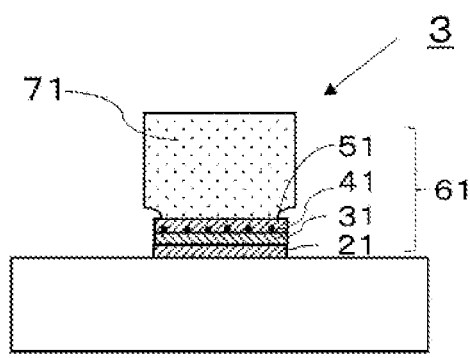

GLASS WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/022857, filed on Jun. 10, 2019, which is based upon and claims the benefit of priority to Japanese Patent Application No. 2018-115885, filed on Jun. 19, 2018, the disclosures of which are incorporated herein by reference in their entireties.

TECHNICAL FIELD

The present invention relates to glass wiring boards.

BACKGROUND ART

In recent years, electronic devices have been increasingly developed with a reduced size to provide higher functionality. Accordingly, there is a demand for an increase in the density of semiconductor modules to be mounted in electronic devices. In order to meet this demand, increasing the wiring density of wiring boards on which semiconductor chips are to be mounted has been studied.

As a core material to be included in the wiring boards, a glass epoxy resin is typically used. In recent years, however, glass wiring boards including a glass plate as a core material have been gaining attention.

A glass plate provides a higher degree of smoothness than a core material made of a glass epoxy resin. Therefore, ultra-fine wiring can be formed on the glass wiring board. Thus, the use of the glass wiring board allows circuit elements to be densely packed.

The coefficient of linear expansion (CTE) of a glass plate, within the temperature range of 20° or more and 260° C. or less, almost coincides with the coefficient of linear expansion of a semiconductor chip made of a silicon substrate within the temperature range of 20° C. or more and 260° C. or less. Therefore, by using a glass wiring board, semiconductor chips can be mounted while reducing residual stress.

Accordingly, glass wiring boards have been gaining attention as one of wiring boards for semiconductor modules to be mounted in high-performance electronic devices.

Examples of the conventional technique for forming wires on a glass plate include a structure having laminated films composed of an electrolytic copper plating film, an electroless nickel-phosphorus plating film, and an inorganic material containing palladium or the like formed on a glass plate (for example, refer to Patent Literature (PTL) 1).

CITATION LIST

Patent Literature

[PTL 1] JP 2017-081781 A

SUMMARY OF THE INVENTION

Technical Problem

It is problematic that when the thickness of a conductor layer including the electrolytic copper plating layer formed immediately on the glass plate is 15 µm or more, stresses in a conductor including the electrolytic copper plating layer cause cracking of the glass plate located below the conductor layer. In order to reduce the cracking, the conductor layer in the glass wiring board needs to be thin, thereby leading to an increase in circuit resistance, which is a problem in electrical characteristics.

In view of this circumstance, there is a demand for a glass wiring board in which cracking does not occur in the glass plate located below the conductor layer even if the conductor layer is made thick. The occurrence of cracking is also an issue in the technique disclosed in PTL 1. If the thickness of the electrolytic copper plating layer in the conductor layer composed of the electrolytic copper plating film, the electroless nickel-phosphorus plating film, and the inorganic material containing palladium or the like is increased, the glass plate located below the conductor layer cracks primarily due to stresses in the electrolytic copper plating layer.

This is due to the fact that, upon formation of wiring on the glass plate, the cross-sectional structure of the conductor layer composed of the electrolytic copper plating film, the electroless nickel-phosphorus plating film, and the inorganic material containing palladium or the like obtained by etching away unnecessary portions of a metal layer has a rectangular cross section, whereby stresses in the electrolytic copper plating layer are likely to be excessively concentrated on the glass plate located immediately below the conductor layer, which results in occurrence of cracking.

Cracking below the conductor layer occurs even when titanium, copper, and the electrolytic copper plating layer are sequentially stacked by sputtering from the glass plate.

The present invention has been conceived in view of the aforementioned problem and aims to provide a glass wiring board in which cracking is reduced by better preventing concentration of stresses in a glass plate on which a conductor layer including an electrolytic copper plating layer is provided.

Solution to Problem

According to one aspect of the present invention, a glass wiring board is characterized by including: a glass plate; a first metal layer covering at least a part of the glass plate; and a second metal layer covering at least a part of the first metal layer, wherein an area of the first metal layer that is in contact with the second metal layer is smaller than an area of the second metal layer facing the first metal layer.

Advantageous Effects of the Invention

According to the present invention, there is provided a glass wiring board which can better prevent concentration of stresses in a glass plate on which a conductor layer including an electrolytic copper plating layer, to thereby better prevent cracks from occurring.

BRIEF DESCRIPTION OF THE DRAWINGS

FIGS. 4(A), 4(B), 4(C), 4(D), 4(E), 4(F), and 4(G) are cross-sectional views schematically showing a method for manufacturing the glass wiring board 2 according to one embodiment of the present invention.

FIGS. 5(A), 5(B), 5(C), 5(D), 5(E), 5(F), and 5(G) are cross-sectional views schematically showing a method for manufacturing a glass wiring board 3 according to an example of the present invention.

DETAILED DESCRIPTION

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

As used herein, "above" refers to a direction receding from the glass substrate, whereas "below" refers to a direction approaching the glass substrate.

Figure 1:
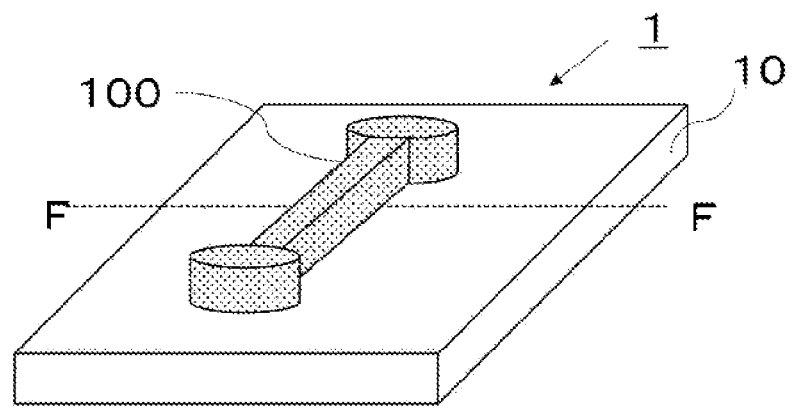
FIG. 1 is a perspective view schematically showing a glass wiring board 1 according to one embodiment of the present invention.

FIG. 1 is a perspective view schematically showing a glass wiring board 1 according to one embodiment of the present invention.

The glass wiring board 1 shown in FIG. 1 includes a glass plate 10 and a conductor layer 100 formed on the glass plate 10.

The glass plate 10 typically has light permeability. The components of a glass material included in the glass plate 10 and the proportion of the components are not limited. The glass plate 10 can be made, for example, from glass having silicate as the main component, such as alkali-free glass, alkali glass, borosilicate glass, quartz glass, sapphire glass, or photosensitive glass. From the perspective that the glass plate 10 is used in a semiconductor package and a semiconductor module, alkali-free glass is desirably used. The alkali component content of the alkali-free glass is preferably 0.1 mass % or less.

The thickness of the glass plate 10 is preferably 1 mm or less. The thickness of the glass plate 10 is more preferably within the range of 0.1 mm or more and 0.8 mm or less, in consideration of ease of forming a through hole and the handleability at the time of manufacture.

Examples of a method for manufacturing the glass plate 10 include a float method, a down-draw method, a fusion method, an up-draw method, and a roll-out method. The glass plate 10 may be produced by any of the foregoing methods.

The coefficient of linear expansion (CTE: Coefficient of Thermal Expansion) of the glass plate 10 is preferably within the range of $0.5\times10^{-6}$/K or more and $160\times10^{-6}$/K or less within the temperature range of 20° C. or more and 260° C. or less, more preferably within the range of $0.8\times10^{-6}$/K or more and $50\times10^{-6}$/K or less, and further preferably within the range of $1.0\times10^{-6}$/K or more and $8.0\times10^{-6}$/K or less. When the coefficient of linear expansion of the glass plate 10 is in this range, the difference from the coefficient of linear expansion of a semiconductor chip including a silicon substrate to be mounted on a surface of the glass wiring board 1 tends to be small. The coefficient of linear expansion refers to the ratio at which the length changes in response to an increase in temperature.

At least one principal surface of the glass plate 10 may include a functional layer. Examples of the functional layer include an antireflection layer containing fine particles, an infrared shielding layer containing an infrared absorbing agent, a strength imparting layer containing a hard coat material, an antistatic layer containing an antistatic agent, a color layer containing a coloring agent, an optical filter layer containing an optical thin film, a texture control layer and an antiglare layer containing a light scattering film. These functional layers can be formed by surface treatment techniques such as evaporation, sputtering, or wet spraying, for example.

The glass plate 10 may have a through hole.

The shape of a cross section of the through hole with respect to the thickness direction may be a rectangle, an X shape in which the diameter of the center of the through hole is smaller than the top diameter and the bottom diameter, a tapered shape in which the bottom diameter of the through hole is smaller than the top diameter, an O shape in which the diameter of the center of the through hole is larger than the top diameter and the bottom diameter, or any other shape.

The shape of a cross section of the through hole perpendicular to the thickness direction may be a circle, an oval, or a polygon.

Figure 2:
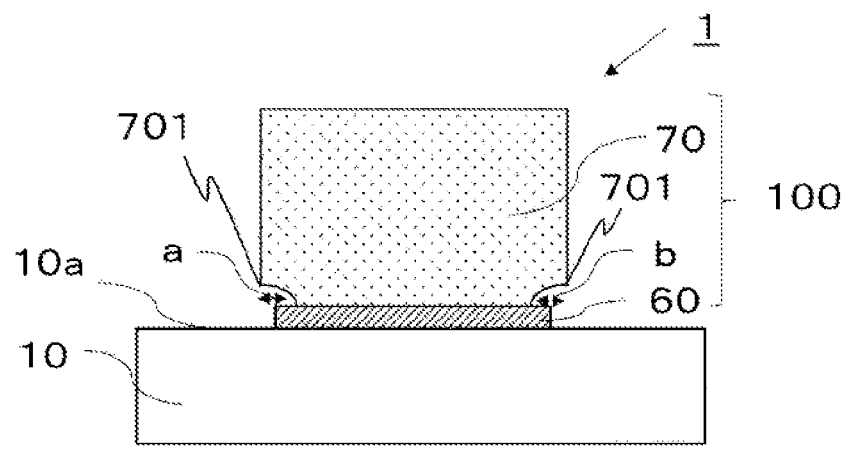
FIG. 2 is a cross-sectional view schematically showing the glass wiring board 1 according to one embodiment of the present invention.

FIG. 2 is a cross-sectional view of the glass wiring board 1 shown in FIG. 1, taken along a plane passing through line F-F so as to be perpendicular to the longitudinal direction of the wiring formed on the glass plate 10.

As shown in FIG. 2, the conductor layer 100 is provided on the glass plate 10, on the surface of the glass principal surface 10a. The conductor layer 100 includes a first metal layer 60 and a second metal layer 70. The conductor layer 100 constitutes circuit wiring or an electrode pad, for example. The conductor layer 100 may be provided on either side or both sides of the glass plate 10.

The first metal layer 60 covering at least a part of the principal surface 10a of the glass plate 10. Furthermore, the second metal layer 70 covering at least a part of the first metal layer 60. The lower surface of the second metal layer 70 is eroded and abraded around the outer edge of the upper surface of the first metal layer 60 and is, in the inner area, in contact with the upper surface of the first metal layer 60. As is clear from the above, the area of the first metal layer 60 that is in contact with the second metal layer 70 is smaller than the area of the second metal layer 70 facing the first metal layer 60. In other words, the lower surface of the second metal layer 70 includes a region that is not in contact with the upper surface of the first metal layer 60 (outer peripheral region).

Specifically, as shown in FIG. 2, recesses 701 are formed at both sides of a surface of the second metal layer 70 facing the first metal layer 60. The recesses 701 have depths a, b from end of the conductor layer toward the center. Thus, the shape of the cross section of the conductor including the first metal layer 60 and the second metal layer 70 is not rectangular but is shaped to include the recesses 701 (narrow portion) around the bonding surface. As a result of providing such recesses 701, the area of contact between the first metal layer 60 and the second metal layer 70 becomes smaller than the area of the lower surface of the second metal layer 70 facing the upper surface of the first metal layer 60. Therefore, as compared to the case where no narrow portion is provided, stresses in the second metal layer 70 are kept from being concentrated on the glass principal surface 10a, and thereby cracks are less likely to be formed.

The depths a, b of the recesses 701 at both sides may be the same or may not be the same.

Figure 3:
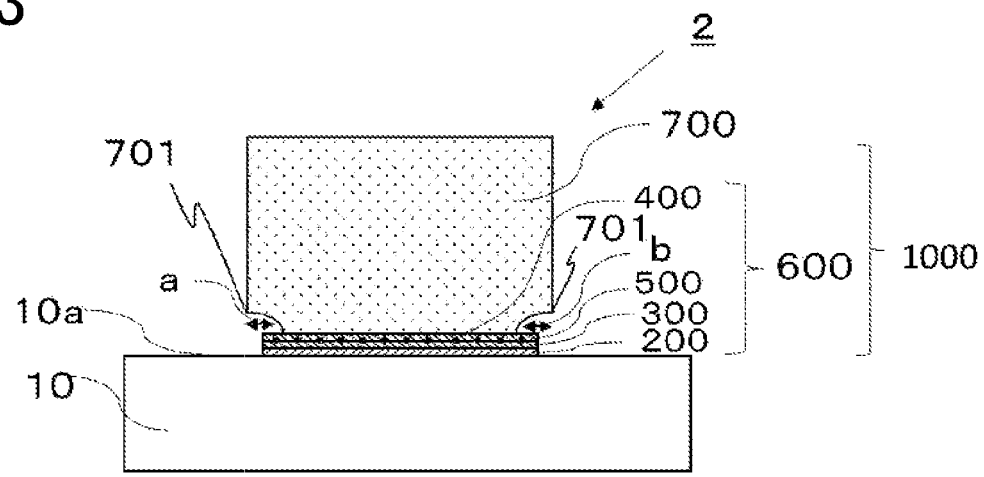
FIG. 3 is a cross-sectional view of a glass wiring board 2 that specifically shows the glass wiring board 1 according to one embodiment of the present invention shown in FIG. 2.

The glass wiring board 2 shown in FIG. 3 shows the glass wiring board 1 shown in FIG. 2 in more detail.

A conductor layer 1000 includes a first metal layer 600 and a second metal layer 700. The first metal layer 600 is formed, for example, by sequentially stacking a metal layer 200, a metal layer 300, and a metal layer 500, with a metal-containing material 400 between the metal layer 300 and the metal layer 500. Note that the number of metal layers in the first metal layer 600 is not limited to this example.

The second metal layer 700 is formed by plating. For example, as plating for forming the second metal layer 700, copper (Cu), an alloy containing copper, or the like is selected, and electrolytic copper plating which has excellent conductivity is preferably used.

The metal layer 200 and the metal layer 300 are formed by sputtering or chemical vapor deposition (CVD). Examples include metals such as copper (Cu), aluminum (Al), titanium (Ti), chromium (Cr), molybdenum (Mo), tungsten (W), tantalum (Ta), gold (Au), iridium (Ir), ruthenium (Ru), palladium (Pd), and platinum (Pt). Furthermore, as the electrically conductive material, Al—Si alloy, Al—Si—Cu alloy, Al—Cu alloy, Ni—Fe alloy, indium tin oxide (ITO), indium zinc oxide (IZO), active zinc oxide (AZO), zinc oxide (ZnO), lead zirconate titanate (PZT), titanium nitride (TiN), $Cu_3N_4$, Cu alloy, or a mixture of them may also be used.

The metal layer 200 and the metal layer 300 are preferably titanium and copper formed by sputtering.

When the metal layer 200 is made of titanium, the thickness of the titanium is preferably within the range of 0.01 μm or more and 0.1 μm or less. Titanium having a thickness of 0.01 μm or more exhibits good adhesion to glass. On the other hand, even if the thickness of the titanium is made to be more than 0.1 μm since the adhesion to glass does not change, the desirable thickness of the titanium is 0.1 μm or less in consideration of productivity.

When the metal layer 300 is made of copper, the thickness of the copper is preferably within the range of 0.09 μm or more and 0.5 μm or less. The metal layer 500 to be described later can be formed densely without pinholes on the metal layer 300 made of copper having a thickness of 0.09 μm or more. This leads to improvements in electrical characteristics. On the other hand, with copper having a thickness of more than 0.5 μm no change is seen in the electrical characteristics, etc. Therefore, in consideration of productivity, the thickness of the copper is desirably 0.5 μm or less.

The metal layer 500 is made of electroless nickel-phosphorus plating. When the metal layer 500 is formed of electroless nickel-phosphorus plating with a lower etch rate than the etch rate of the second metal layer 700 made of electrolytic copper plating, the surface of the second metal layer made of electrolytic copper plating in contact with the first metal layer 600 is preferentially etched in the step for etching away unnecessary portions of the metal layer 500 made of electroless nickel-phosphorus plating during wiring formation, and thus recesses 701 are formed on the surface of the second metal layer 700 made of electrolytic copper plating in contact with the first metal layer 600.

Consequently, the area of the second metal layer 700 made of electrolytic copper plating that is in contact with the first metal layer 600 is smaller than the area of the lower surface of the second metal layer 700 facing the upper surface of the first metal layer 600.

The electroless nickel-phosphorus plating layer may contain other components such as sulfur (S), lead (Pb), and bismuth (Bi) in addition to nickel and phosphorus.

An electroless nickel-phosphorus plating solution includes a reducing agent and a metallic salt containing nickel. Examples of the metallic salt containing nickel include nickel sulfate, nickel chloride, and a mixture of them. The density of the metallic salt containing nickel included in the electroless nickel-phosphorus plating solution is preferably within the range of 10 g/L or more and 60 g/L or less, more preferably within the range of 15 g/L or more and 45 g/L or less, and further preferably within the range of 20 g/L or more and 30 g/L or less.

The reducing agent reduces the metallic salt containing nickel. The reducing agent can be formalin, hydrazine, hypophosphorous acid, sodium hypophosphite, sodium borohydride, or a mixture of them, for example. However, it is preferable to use hypophosphorous acid, sodium hypophosphite, or a mixture of these. The density of the reducing agent included in the electroless nickel-phosphorus plating solution is preferably within the range of 10 g/L or more and 60 g/L or less, more preferably within the range of 15 g/L or more and 45 g/L or less, and further preferably within the range of 20 g/L or more and 30 g/L or less.

The electroless nickel-phosphorus plating solution may further include a metal-based additive, an organic additive, a complexing agent, a pH adjusting agent, a buffering agent, or a mixture thereof.

The metal-based additive enhances the stability of the electroless nickel-phosphorus plating solution. The metal-based additive contains lead, bismuth, and a mixture of these.

The organic additive facilitates the precipitation of nickel. The organic additive contains sulfur, for example.

Examples of the complexing agent include an ammonium hydroxide, sodium citrate, ethylene glycol, and a mixture of them. The density of the complexing agent included in the electroless nickel-phosphorus plating solution is preferably within the range of 10 g/L or more and 60 g/L or less, more preferably within the range of 10 g/L or more and 50 g/L or less, and further preferably within the range of 20 g/L or more and 30 g/L or less.

Examples of the pH adjusting agent include sodium hydroxide, ammonia, sulfuric acid, and a mixture of them.

Examples of the buffering agent include sodium citrate, boric acid, carbonic acid, and a mixture of them.

The electroless nickel-phosphorus plating solution may contain ammonium chloride. The density of the ammonium chloride included in the electroless nickel-phosphorus plating solution is preferably within the range of 10 g/L or more and 60 g/L or less, more preferably within the range of 10 g/L or more and 50 g/L or less, and further preferably within the range of 20 g/L or more and 30 g/L or less.

In the case where the phosphorus content of the electroless nickel-phosphorus plating film is set between 5 mass % or more and 12 mass % or less, inclusive, the pH of the electroless nickel-phosphorus plating solution is preferably set within the range of 3 or more and 6 or less, and more preferably set within the range of 5.0 or more and 5.5 or less. Furthermore, the temperature of the electroless nickel-phosphorus plating solution is preferably set within the range of 60° C. or more and 80° C. or less, for example.

In the case where the phosphorus content of the electroless nickel-phosphorus plating film is set between 0.5 mass % or more and less than 5 mass %, inclusive, the pH of the electroless nickel-phosphorus plating solution is preferably set within the range of 7 or more and 9 or less, and the temperature of the electroless nickel-phosphorus plating solution is preferably set within the range of 30° C. or more and 60° C. or less, for example, in the electroless plating process.

The thickness of the electroless nickel-phosphorus plating layer can be obtained by X-ray fluorescence elemental analysis, for example.

The metal-containing material 400 is located between the metal layer 300 made of copper and the metal layer 500 made of electroless nickel-phosphorus plating. The metal-containing material 400 contains at least palladium. The metal-containing material 400 may be made up of layers. The palladium contained in the metal-containing material 400 serves as a catalyst for forming electroless nickel-phosphorus plating. The palladium may be a single element, a mixture with an inorganic material, a mixture with an organic material, or a mixture with an inorganic material and an organic material.

At the interface where the second metal layer 700 made of electrolytic copper plating and the metal layer 500 made of electroless nickel-phosphorus plating come in contact with each other, the recess formed in the second metal layer 700 can be managed according to the coverage of the palladium contained in the metal-containing material 400 (the amount of palladium per unit area). As the coverage of the palladium increases from 0.01 µg/cm² to 500 µg/cm², the area of contact between the second metal layer 700 made of electrolytic copper plating and the metal layer 500 made of electroless nickel-phosphorus plating is reduced. In other words, the depths a, b of the recesses 701 increase.

The coverage of the palladium contained in the metal-containing material 400 with respect to the metal layer 300 made of copper is preferably within the range of 0.01 µg/cm² or more and 500 µg/cm² or less, based on palladium alone, according to an X-ray fluorescence analyzer. If the coverage of the palladium is less than 0.01 µg/cm², the palladium exhibits low catalytic activity, and the metal layer 500 made of electroless nickel-phosphorus plating becomes difficult to form, which is not desirable. The cross-sectional structure of the conductor layer 1000 becomes nearly rectangular, and a crack reducing effect is not obtained.

The metal-containing material 400 containing at least palladium is removed when the metal layer 500 made of electroless nickel-phosphorus plating and the metal layer 300 made of copper are etched during wiring formation. However, if the coverage of the palladium is more than 500 µg/cm², it becomes difficult to remove the palladium contained in the metal-containing material 400 when the metal layer 500 made of electroless nickel-phosphorus plating and the metal layer 300 made of copper are etched, which is not desirable. The coverage of the palladium is more preferably within the range of 1 µg/cm² or more and 100 µg/cm² or less.

The coverage of the palladium in the metal-containing material 400 to the metal layer 300 made of copper can be controlled by a time of immersion in a palladium treatment solution when the metal layer 300 is catalyzed. As the palladium treatment solution, a solution containing palladium complex, a colloidal solution containing tin and palladium, or the like can be used.

On each interface of the metal layer 200 made of titanium, the metal layer 300 made of copper, the metal-containing material 400 containing at least palladium, and the metal layer 500 made of electroless nickel-phosphorus plating, an intermetallic compound layer derived from a corresponding metal may be formed.

In the cross-sectional view, the area of contact between the metal layer 200 made of titanium and the metal layer 300 made of copper, and the area of contact between the metal layer 300 and the metal layer 500 made of electroless nickel-phosphorus plating may not be the same.

Next, one example of a method for manufacturing the above-described glass wiring board 2 shown in FIG. 3 is described with reference to FIGS. 4(A) to 4(G).

First, the glass plate 10 is prepared. Next, as shown in FIG. 4(A), the metal layer 200 and the metal layer 300 are sequentially stacked on the principal surface 10a of the glass plate 10 from the glass surface. Specifically, a titanium layer and a copper layer are formed by sputtering on one of the principal surfaces of the glass plate 10 as the metal layer 200 and the metal layer 300, respectively.

Next, as shown in FIG. 4(B), the metal-containing material 400 is formed on the metal layer 300, and then the metal layer 500 is formed above them. Specifically, as the metal-containing material 400 and the metal layer 500, a layer containing at least palladium and an electroless nickel-phosphorus plating layer are formed, respectively.

Next, as shown in FIG. 4(C), a dry film resist is laminated on the metal layer 500 made of electroless nickel-phosphorus plating provided above the glass principal surface 10a, using a roll laminator or the like, and a resist layer RE1 having an opening RE0 is formed by photolithography.

Next, as shown in FIG. 4(D), the second metal layer 700 made of electrolytic copper plating is formed on the metal layer 500 made of electroless nickel-phosphorus plating by electroplating in an electrolytic copper plating solution.

Next, the resist layer RE1 is stripped in a sodium hydroxide solution, a TMAH solution, or the like, and thus a substrate shown in FIG. 4(E) is obtained.

Next, as shown in FIG. 4(F), the metal layer 500 made of electroless nickel-phosphorus plating and the metal layer 300 made of copper are sequentially etched. At this time, as a result of the catalytic reaction of the palladium in the metal-containing material 400, erosion of the second metal layer 700 made of electrolytic copper plating proceeds at the outer periphery of the surface on which the second metal layer 700 is in contact with the metal layer 500 made of the electroless nickel-phosphorus plating layer, and thus the recesses 701 are formed.

Next, the metal layer 200 made of titanium is etched, and a glass wiring board such as that shown in FIG. 4(G) is obtained. In this manner, the first metal layer 600 which covers at least a part of the glass plate 10 and includes the metal layer 200, the metal layer 300, the metal-containing material 400, and the metal layer 500 and the second metal layer 700 which covers at least a part of the first metal layer are obtained. Furthermore, a glass wiring board is obtained in which the area of the first metal layer 600 in contact with the second metal layer 700 is smaller than the area of the second metal layer 700 on the surface facing the first metal layer 600.

The above-described structure of the glass wiring board allows a reduction in stresses in a glass located immediately below the second metal layer 700 made of electrolytic copper plating, keeping the glass plate 10 from cracking even when the electrolytic copper plating layer is formed having a thickness of more than 15 μm.

The present invention is not limited to the embodiments and modification examples described above. Besides, various modification examples can be carried out without deviating from the gist of the present invention.

EXAMPLES

Hereinafter, examples related to evaluation of glass cracking below the conductor layer are described in comparison with comparative examples.

[Determination of Glass Cracking Below Conductor Layer]

In each of the glass wiring boards obtained in Examples 1, 2 and Comparative Example 1, the glass plate located below the conductor layer was observed with a scanning electron microscope (SEM) to determine the presence of glass cracking under the condition that the number of samples was 10.

Example 1

In the present example, a glass wiring board 3 was produced according to the manufacturing example in FIG. 5.

First, as shown in FIG. 5(A), a 300 μm-thick glass plate 11 (OA-10G manufactured by Nippon Electric Glass Co., Ltd.) was prepared, and a 50 nm-thick titanium layer 21 and a 300 nm-thick copper layer 31 were deposited on a surface of the glass plate 11 by sputtering.

Next, as shown in FIG. 5(B), a palladium-containing material 41 was provided on the copper layer 31. The palladium-containing material 41 was formed by immersing the substrate shown in FIG. 5(A) in a 1 g/L palladium chloride solution at room temperature for 60 seconds. The coverage of palladium in the palladium-containing material 41 on the copper layer 31 was 1 μg/cm². Furthermore, a 0.1 μm-thick electroless nickel-phosphorus plating layer 51 was formed on the palladium-containing material 41 by immersion in a plating solution.

In this manner, a first metal layer 61 including the titanium layer 21, the copper layer 31, the palladium-containing material 41, and the electroless nickel-phosphorus plating layer 51 was provided on the glass plate 11.

Next, as shown in FIG. 5(C), a first resist layer RE2 was formed by laminating a 56 μm-thick photosensitive dry film resist on the electroless nickel-phosphorus plating layer 51 using a roll laminator, and the opening RE0 was provided by exposure and development at a predetermined position. The size of the opening RE0 was approximately 500 μm×500 μm.

Next, as shown in FIG. 5(D), an electrolytic copper plating layer 71 was formed to have a thickness of 15 μm at 1 ASD (current density) by immersing the substrate in a copper sulfate plating solution.

Next, the substrate obtained in FIG. 5(D) was immersed in a 5% sodium hydroxide aqueous solution at 60° C. to strip RE2, and the substrate in FIG. 5(E) was obtained.

Next, as shown in FIG. 5(F), the electroless nickel-phosphorus plating layer 51, the palladium-containing material 41, and the copper layer 31 were etched using a mixed solution of aqueous hydrogen peroxide mixed with sulfate (pH 1 with a temperature of 25° C.), and thus the electrolytic copper plating layer 71 including the recesses 701 was obtained.

Next, as shown in FIG. 5(G), the titanium layer 21 was removed using a mixed solution of aqueous hydrogen peroxide mixed with ammonia water (pH 9 with a temperature of 25° C.).

In this manner, the first metal layer 61 including the titanium layer 21 covering at least a part of the glass, the copper layer 31, the palladium-containing material 41, and the electroless nickel-phosphorus plating layer 51 and the electrolytic copper plating layer 71 which covers at least a part of the first metal layer 61, serving as the second metal layer, were obtained. Furthermore, a glass wiring board 3 was obtained in which the area of contact between the first metal layer 61 and the electrolytic copper plating layer 71 serving as the second metal layer was smaller than the area of the electrolytic copper plating layer 71 serving as the second metal layer on the surface facing the first metal layer 61.

At this time, the area of contact between the first metal layer 61 and the electrolytic copper plating layer 71 serving as the second metal layer was 24.9×10³ μm². Meanwhile, the area of the electrolytic copper plating layer 71 serving as the second metal layer facing the first metal layer 61 was 25.0×10³ μm². Note that in order to calculate these areas, the glass wiring board 3 was cut, the cut surface was observed with a microscope, the dimension of the upper surface of the first metal layer 61 was determined, and the dimension of the lower surface of the second metal layer 71 that laterally protrudes beyond the upper surface of the first metal layer 61 was obtained, and each of the areas was calculated.

Example 2

In this Example 2, the thickness of the electrolytic copper plating layer 71 in Example 1 was set to 25 μm. Other than this, the same manufacturing method as that in Example 1 was applied to Example 2.

At this time, the area of contact between the first metal layer 61 and the electrolytic copper plating layer 71 serving as the second metal layer was $24.5 \times 10^3$ µm². The area of the electrolytic copper plating layer 71 serving as the second metal layer facing the first metal layer 61 was $25.0 \times 10^3$ µm².

Comparative Example 1

In Comparative Example 1, the palladium-containing material 41 and the electroless nickel-phosphorus plating layer 51 were not used, and the electrolytic copper plating layer 71 serving as the second metal layer was formed above the titanium layer 21 and the copper layer 31. Other than that, the same manufacturing method as that in Example 1 was applied to obtain a glass wiring board.

The electrolytic copper plating layer in the conductor layer obtained did not include the recesses; a conductor layer having a rectangular cross-section (not shown in the drawings) was obtained. Specifically, the area of contact between the copper layer 31 serving as the first metal layer and the electrolytic copper plating layer 71 serving as the second metal layer, and the area of the electrolytic copper plating layer 71 serving as the second metal layer facing the copper layer 31 serving as the first metal layer were both $25.0 \times 10^3$ µm².

Table 1 collectively shows the results of Examples 1, 2 and Comparative Example 1 described above. Note that in the evaluation of glass cracking, the presence of cracks was determined by visually checking a surface of the glass wiring board with the microscope. In the evaluation in Table 1, 10/10 OK indicates that when 10 samples were evaluated, no cracks occurred in all the 10 samples, and 10/10 NG indicates that when 10 samples were evaluated, cracks occurred in all the 10 samples.

TABLE 1

|  | First metal layer (from glass surface) | Thickness of electrolytic copper plating layer (second metal layer) (µm) | Area of first metal layer in contact with second metal layer (×10³ µm²) | Area of second metal layer facing first metal layer (×10³ µm²) | Glass cracking |
|---|---|---|---|---|---|
| Example 1 | Titanium/copper/palladium-containing material/electroless nickel-phosphorus | 15 | 24.9 | 25 | Good (10/10 OK) |
| Example 2 |  | 25 | 24.5 | 25 | Good (10/10 OK) |
| Comparative Example 1 | Titanium/copper | 15 | 25 | 25 | Poor (10/10 NG) |

As shown in Table 1, in each of the glass wiring boards according to Examples 1 and 2, both in the case where the thickness of the electrolytic copper plating layer was set to 15 µm and the case where the thickness of the electrolytic copper plating layer was set to 25 µm, no glass cracking was confirmed below the conductor layer including the titanium layer, the copper layer, the electroless nickel-phosphorus plating layer, and the electrolytic copper plating layer. On the other hand, in the glass wiring board according to Comparative Example 1, cracking occurred in all the glass wiring boards even when the thickness of the electrolytic copper plating layer was 15 µm. Thus, the advantageous effects obtained by the use of the palladium-containing material were confirmed.

REFERENCE SIGNS LIST 1, 2, 3 . . . Glass wiring board; 10, 11 . . . Glass plate; 20, 30, 50 . . . Metal layer; 40 . . . Metal-containing layer; 60, 61, 600 . . . First metal layer; 70, 700 . . . Second metal layer; 21 . . . Titanium layer; 31 . . . Copper layer; 41 . . . Palladium-containing material; 51 . . . Electroless nickel-phosphorus plating layer; 71 . . . Electrolytic copper plating layer; 701 . . . Recess; RE1, RE2 . . . Resist layer.

What is claimed is:

1. A glass wiring board, comprising:
   a glass plate;
   a first metal layer covering at least a part of the glass plate; and
   a second metal layer covering at least a part of the first metal layer, wherein
   an area of the first metal layer in contact with the second metal layer is smaller than an area of the second metal layer facing the first metal layer; and,
   the second metal layer is an electrolytic copper plating layer.

2. The glass wiring board of claim 1, wherein the first metal layer is formed by stacking a plurality of metals.

3. The glass wiring board of claim 2, wherein in the first metal layer, titanium, copper, and electroless nickel-phosphorus plating are sequentially stacked from the glass plate, and a palladium-containing material is disposed between a layer of the copper and a layer of the electroless nickel-phosphorus plating.

4. The glass wiring board of claim 1, wherein the second metal layer is eroded around an outer periphery of a surface in contact with the first metal layer.

5. The glass wiring board of claim 1, wherein the second metal layer is eroded around an outer periphery of a surface in contact with the first metal layer.

6. The glass wiring board of claim 1, wherein a coefficient of linear expansion of the glass plate is within a range of $0.5 \times 10^{-6}$/K or more and $160 \times 10^{-6}$/K or less for each temperature within a temperature range of 20° C. or more and 260° C. or less.

7. The glass wiring board of claim 1, wherein a coefficient of linear expansion of the glass plate is within a range of range of $1.0 \times 10^{-6}$/K or more and $8.0 \times 10^{-6}$/K or less for each temperature within a temperature range of 20° C. or more and 260° C. or less.

* * * * *